(12) United States Patent
Carter et al.

(10) Patent No.: US 7,937,247 B2
(45) Date of Patent: May 3, 2011

(54) VIRTUAL METERING

(75) Inventors: Ronald W. Carter, Murfreesboro, TN (US); Jon A. Bickel, Murfreesboro, TN (US); Amjad Hasan, Murfreesboro, TN (US)

(73) Assignee: Square D Company, Palatine, IL (US)

( * ) Notice: Subject to any disclaimer, the term of this patent is extended or adjusted under 35 U.S.C. 154(b) by 443 days.

(21) Appl. No.: 12/228,394

(22) Filed: Aug. 12, 2008

(65) Prior Publication Data

US 2010/0042372 A1 Feb. 18, 2010

(51) Int. Cl.
*G06F 19/00* (2006.01)
(52) U.S. Cl. .......................................... 702/189; 714/25
(58) Field of Classification Search .................. 702/189, 702/182–185, 188; 714/25
See application file for complete search history.

(56) References Cited

U.S. PATENT DOCUMENTS

| 7,272,518 B2 | 9/2007 | Bickel et al. ..................... 702/61 |
| 2010/0030521 A1 * | 2/2010 | Akhrarov et al. ............. 702/182 |

FOREIGN PATENT DOCUMENTS

| EP | 1217381 A2 | 6/2002 |
| WO | WO 2009/061291 A1 | 5/2009 |

OTHER PUBLICATIONS

Written Opinion corresponding to co-pending International Patent Application Serial No. PCT/US2009/053174, European Patent Office; dated Apr. 8, 2010; (4 pages).
International Search Report corresponding to co-pending International Patent Application Serial No. PCT/US2009/053174, European Patent Office; dated Apr. 8, 2010; (3 pages).

* cited by examiner

*Primary Examiner* — Edward Raymond

(57) ABSTRACT

Methods for improving the accuracy of characterizing unmonitored paths or virtual meters in a utility system. The hierarchical arrangement of IEDs in the utility system is determined. Measured quantities of a characteristic of the utility being monitored are received and error-adjusted using statistical or absolute methods. The statistical method accounts for the mean and standard deviation associated with error measurements of the subject IED, and the absolute method uses the absolute value of the error measurement, expressed as a percentage, to produce ranges of measured quantities within an error tolerance. The differences between the error-adjusted quantities are analyzed to determine whether an unmonitored path exists, and if so, whether the virtual meter is consuming or supplying the utility. The order in which IEDs are read is determined so that a parent and its children are read in sequence to increase synchronicity of the received data and the virtual meter evaluation.

20 Claims, 5 Drawing Sheets

VIRTUAL METERING

FIELD OF THE INVENTION

Aspects disclosed herein relate generally to utility systems, and, in particular, to methods for automatically improving the accuracy of identifying virtual monitoring devices in a utility monitoring system.

BACKGROUND

Because energy consumers cannot afford to install monitoring equipment and devices at every point of utilization within their facility, nearly every monitoring system has unmetered or unmonitored loads. In many cases these unmetered loads can account for a substantial portion of the customer's usage of a utility. Although the primary charter of monitoring equipment manufacturers is to provide utility consumers with useful and accurate information on the quality and consumption of a utility within their facility, a proper evaluation of these unmetered loads through the use of virtual meters is often overlooked in the manufacturers' product offerings.

Many monitoring systems include a large number of physical intelligent electronic devices (IEDs). Each IED measures data either continuously or as requested by the software managing the monitoring system. Spatial context of the physical IEDs manifested as a hierarchy is generally not a consideration for determining the order of interactions between the physical monitoring devices and the managing software. In fact, the order of interactions is commonly arbitrarily set by the software managing the power monitoring system.

What is needed, therefore, are methods and systems for improving the accuracy of virtual meters in utility monitoring systems, which can account for a large percentage of customer loads.

BRIEF SUMMARY

A virtual meter or virtual device is not a physical intelligent electronic device (IED). Virtual meters are essentially a logical mathematical deduction made from the combination of data measured in nearby physical IEDs. The law of conservation of energy states that energy may neither be created nor destroyed. Therefore, the sum of all the energies into and out of a system node must be zero. Using this principle, the energy flowing into a system bus must equal the energy flowing out of that system bus. FIG. 1 illustrates a simplified hierarchy of a utility system 102 that includes both real or physical meters ($M_1$, $M_2$, $M_3$, $M_4$, $M_5$) and a virtual meter ($V_1$). The energy flowing into the system bus 103 as measured by IED $M_2$ is diverted into some unknown number of paths. In this example, the energy flowing through two of those paths is being measured by physical IEDs ($M_4$ and $M_5$). If the energy flow measured in IED $M_2$ equals the energy flow measured in IEDs $M_4$ and $M_5$ collectively, then it can be deduced that no further paths exist because the law of conservation of energy is satisfied. However, if the energy flow measured in IED $M_2$ is not equal to the energy flow measured in IEDs $M_4$ and $M_5$, there must be some indefinite number of additional paths present that are unmetered if the system is ideal. Although determining the exact number of additional paths is not readily feasible (without visual inspection), it is possible to determine the aggregate energy flow through these additional unmetered paths in an ideal system. A method for calculating the aggregate energy flow in ideal systems is performed by calculating the difference in energy flow between the devices measuring energy flowing into the system node (here, $M_2$) and the devices measuring energy flow out of the system node (here, $M_4$, and $M_5$). In FIG. 1, the power, P, consumed by the unmetered load(s) connected to the unmetered path(s) (represented by virtual meter $V_1$) is calculated by $P_{M2} - (P_{M4} + P_{M5})$, where $P_{MN}$ represents the power measured by device $M_N$.

There are two potential concerns that can arise which adversely affect the accuracy of virtual meters, and virtual load monitoring in general. The first concern is the inherent accuracy constraints of the physical IEDs, and the second concern is the precision of synchronously sampling data across the physical IEDs used to calculate the virtual meter's data. The aspects disclosed herein provide methods and systems for addressing these and other concerns to improve the accuracy of virtually metered load data. Although the examples in this document are electrical in nature, this invention is useful in all forms of WAGES (water, air, gas, electricity, and steam) utility systems.

According to an aspect disclosed herein, a method of automatically determining whether an unmonitored portion exists in a utility system, includes: determining a hierarchy of the utility system, the hierarchy indicating how a number of intelligent electronic devices (IEDs) are linked to one another in the utility system, each of the IEDs monitoring one or more characteristics of a utility; automatically storing a data representation of the hierarchy; identifying, from the hierarchy, a parent IED in the hierarchy that is directly linked to at least one child IED; identifying, from the hierarchy, all of one or more child IEDs that are directly linked in the hierarchy to the parent IED; receiving from the parent IED a measured quantity, $P_P$, of the characteristic of the utility measured by the parent IED; receiving from each of the one or more child IEDs respective measured quantities of the characteristic of the utility measured by each of the one or more child IEDs; adjusting the measured quantities measured by the parent IED and by the one or more child IEDs as a function of respective measurement errors associated with the parent IED and with the one or more child IEDs to produce respective error-adjusted quantities; and based on the error-adjusted quantities, determining whether an unmonitored quantity exists in the utility system, and, if so, storing an indication that a virtual device directly linked to the parent IED exists in the hierarchy.

The determining the hierarchy can be carried out automatically. The method can further include: calculating a difference between (a) the error-adjusted quantity associated with the parent IED and (b) the sum of the error-adjusted quantities associated with the one or more child IEDs, wherein the determining whether the unmonitored quantity exists in the utility system includes determining whether the calculated difference is within an error tolerance, and, if not, carrying out the storing; and storing the unmonitored quantity and an indication that the virtual device is consuming or producing the unmonitored quantity.

The function for producing the error-adjusted quantity associated with the parent can include calculating a minimum quantity, $P_{PTMIN}$, and a maximum quantity, $P_{PTMAX}$, based on at least $P_P$, a mean of measurement error associated with the parent IED, and a standard deviation of measurement error associated with the parent IED.

The function for producing the error-adjusted quantities associated with the one or more child IEDs can include: calculating a minimum quantity, $P_{SMIN}$, based on $P_{PTMIN}$, an aggregate mean associated with a mean of measurement error of each of the one or more child IEDs, and an aggregate standard deviation associated with a standard deviation of measurement error of each of the one or more child IEDs; calculating a maximum quantity, $P_{SMAX}$, based on $P_{PTMAX}$, the aggregate mean, and the aggregate standard deviation; calculating a minimum difference quantity, $P_{DMIN}$, between $P_{PTMIN}$ and $P_{SMAX}$; and calculating a maximum difference quantity, $P_{DMAX}$, between $P_{PTMAX}$ and $P_{SMIN}$.

The method can further include adding the respective measured quantities measured by the one or more IEDs to produce a total measured quantity, $P_S$, wherein the determining whether the unmonitored quantity exists in the utility system includes, responsive to $P_P-P_S$ being greater than or equal to $P_{DMIN}$ and $P_P-P_S$ being less than or equal to $P_{DMAX}$, determining that no unmonitored quantity exists.

The method can further include adding the respective measured quantities measured by the one or more IEDs to produce a total measured quantity, $P_S$, wherein the determining whether the unmonitored quantity exists in the utility system further includes, responsive to $P_P-P_S$ being less than $P_{DMIN}$, determining that the unmonitored quantity does exist and storing an indication that the virtual device is supplying the characteristic of the utility to the utility system.

The method can further include adding the respective measured quantities measured by the one or more IEDs to produce a total measured quantity, $P_S$, wherein the determining whether the unmonitored quantity exists in the utility system further includes, responsive to $P_P-P_S$ being greater than $P_{DMAX}$, determining that the unmonitored quantity does exist and storing an indication that the virtual device is consuming the characteristic of the utility to the utility system.

The function for producing the error-adjusted quantity associated with the parent can include calculating a minimum quantity, $P_{PMIN}$, and a maximum quantity, $P_{PMAX}$, based on at least $P_P$ and an absolute measurement error associated with the parent IED.

The function for producing the error-adjusted quantities associated with the one or more child IEDs can include: calculating a minimum quantity, $P_{SMIN}$, based on the sum of the measured quantities measured by the one or more child IEDs and an absolute measurement error associated with the one or more child IEDs; calculating a maximum quantity, $P_{SMAX}$, based on the sum of the measured quantities measured by the one or more child IEDs and an absolute measurement error associated with the one or more child IEDs; calculating an absolute minimum difference quantity, $P_{DMIN}$, between $P_{PMIN}$ and $P_{SMAX}$; calculating an absolute maximum difference quantity, $P_{DMAX}$, between $P_{PMAX}$ and $P_{SMIN}$.

The method can further include adding the respective measured quantities measured by the one or more IEDs to produce a total measured quantity, $P_S$, wherein the determining whether the unmonitored quantity exists in the utility system further includes, responsive to $P_P-P_S$ being greater than or equal to $P_{DMIN}$ and $P_P-P_S$ being less than or equal to $P_{DMAX}$, determining that no unmonitored quantity exists.

The method can further include adding the respective measured quantities measured by the one or more IEDs to produce a total measured quantity, $P_S$, wherein the determining whether the unmonitored quantity exists in the utility system further includes, responsive to $P_P-P_S$ being less than $P_{DMIN}$, determining that the unmonitored quantity does exist and storing an indication that the virtual device is supplying the characteristic of the utility.

The method can further include adding the respective measured quantities measured by the one or more IEDs to produce a total measured quantity, $P_S$, wherein the determining whether the unmonitored quantity exists in the utility system further includes, responsive to $P_P-P_S$ being greater than $P_{DMAX}$, determining that the unmonitored quantity does exist and storing an indication that the virtual device is consuming the characteristic of the utility.

The IEDs can be power meters, the utility can be electricity, and the one or more characteristics can include power, current, or voltage.

The utility can be water, air, gas, electricity, or steam, and wherein the one or more characteristic includes power, voltage, current, voltage distortion, BTU per hour, MBTU per hour, energy, gallons per minute, or cubic feet per minute.

The method can further include determining a reading order of the respective measured quantities from the parent IED and the one or more child IEDs such that, after the measured quantity is received from the parent IED, the measured quantities from each of the one or more child IEDs are received prior to receiving a measured quantity from any other IED in the hierarchy.

According to another aspect disclosed herein, a method of automatically determining a reading order of respective quantities indicative of a characteristic of a utility monitored by intelligent electronic devices (IEDs) arranged in a hierarchy of a utility system, includes: receiving a data representation of a hierarchy of the utility system, the hierarchy indicating how a number of intelligent electronic devices (IEDs) are linked to one another in the utility system, each of the IEDs monitoring one or more characteristics of a utility; identifying, from the hierarchy, a parent IED in the hierarchy that is directly linked to at least one child IED; identifying, from the hierarchy, all of one or more child IEDs that are directly linked in the hierarchy to the parent IED; automatically determining a reading order of respective quantities indicative of a characteristic of a utility measured by the IEDs such that, after a measured quantity is received from the parent IED, measured quantities from each of the one or more child IEDs are received prior to receiving a measured quantity from another IED in the hierarchy; and automatically determining a quantity of a characteristic of a utility attributable to an unmonitored portion of the hierarchy.

The method can further include receiving from the parent IED, according to the reading order, a measured quantity, $P_P$, of the characteristic of the utility measured by the parent IED; receiving from each of the one or more child IEDs, according to the reading order, respective measured quantities of the characteristic of the utility measured by each of the one or more child IEDs; adjusting the measured quantities measured by the parent IED and by the one or more child IEDs as a function of respective measurement errors associated with the parent IED and with the one or more child IEDs to produce respective error-adjusted quantities; and based on the error-adjusted quantities, determining whether an unmonitored quantity exists in the utility system, and, if so, storing the unmonitored quantity and an indication that a virtual device corresponding to the unmonitored quantity is directly linked to the parent IED in the hierarchy.

The method can further include calculating a difference between (a) the error-adjusted quantity associated with the parent IED and (b) the sum of the error-adjusted quantities associated with the one or more child IEDs, wherein the determining whether the unmonitored quantity exists in the utility system includes determining whether the calculated difference is within an error tolerance, and, if not, carrying out the storing.

The IEDs can be power meters, the utility can be electricity, and the one or more characteristics can include power, current, or voltage.

The utility can be water, air, gas, electricity, or steam, and the one or more characteristic can include power, voltage, current, voltage distortion, BTU per hour, MBTU per hour, energy, gallons per minute, or cubic feet per minute.

The foregoing and additional aspects of the present invention will be apparent to those of ordinary skill in the art in view of the detailed description of various embodiments, which is made with reference to the drawings, a brief description of which is provided next.

BRIEF DESCRIPTION OF THE DRAWINGS

The foregoing and other advantages of the invention will become apparent upon reading the following detailed description and upon reference to the drawings.

Figure 1:
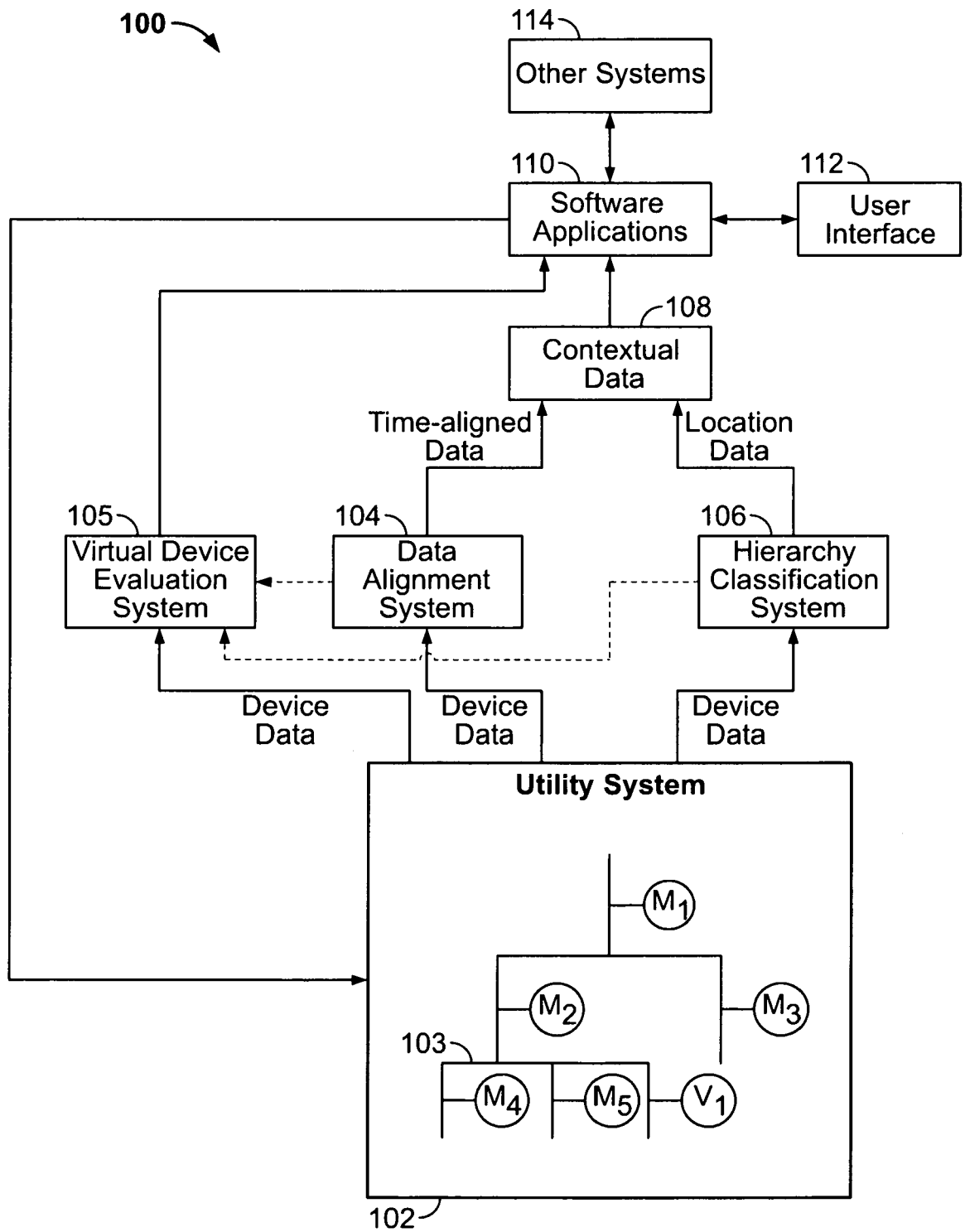
FIG. 1 is a functional block diagram of an automated data integrated monitoring system that includes a virtual device evaluation system.

While the invention is susceptible to various modifications and alternative forms, specific embodiments have been shown by way of example in the drawings and will be described in detail herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION

Turning now to FIG. 1, an automated data integrated monitoring system 100 is generally shown. An electrical system 102 having multiple physical intelligent electronic devices (hereafter "IEDs") designated by the letter M provides data from each IED M that is communicated to an automated data alignment system 104 and an automated hierarchy classification system 106. As used herein, an IED refers to any physical or real system element or apparatus with the ability to sample, collect, or measure one or more operational characteristics or parameters (characteristics and parameters are used interchangeably herein) of a utility monitoring system 102. The data is aligned automatically in temporal or pseudo-temporal context in the automated data alignment system 104 and produces data that is temporally aligned such that it represents the data when it was actually seen simultaneously by the monitoring devices M in the utility monitoring system 102. The hierarchy classification system 106 automatically learns the hierarchy of monitoring devices present in the electrical system 102 and their positional relationships relative to one another. Examples of the hierarchy classification system 106 and the auto-learned hierarchy algorithms 400, 500, 550 associated therewith are described in commonly assigned U.S. Pat. No. 7,272,518, titled "Automated Hierarchy Classification in Utility Monitoring Systems," issued Sep. 18, 2007, and in commonly assigned PCT Patent Application No. PCT/US2006/034394, titled "Improvements in Hierarchy Determination for Power Monitoring Systems," filed Nov. 5, 2007 [SPL-0099]. A hierarchy as used herein includes a series of ordered groupings of things within a system. These relationships may be physical (based on a power system one-line diagram for example) or functional (based on cost centers or other organizational divisions). In an electrical power system context, a hierarchy describes the organization of the electrical power system (whether utility-side or demand-side of the point-of-common coupling (PCC)). As used herein, an "auto-learned hierarchy algorithm" refers to any of the auto-learned hierarchy algorithms disclosed in U.S. Pat. No. 7,272,518.

Each physical IED (M) measures characteristics of the utility monitoring system 102, and quantifies these characteristics into data that can be analyzed by a computer. For example, in an electrical system, the IED can measure power, energy, current, voltage, or other characteristics of electricity. In the electrical context, the IED may be based on a PowerLogic® Series 3000/4000 Circuit Monitor or a PowerLogic® ION7550/7650 Power and Energy Meter available from Schneider Electric or any other suitable IED device such as a microprocessor-based circuit breaker, relay, metering device, energy meter, or power meter. In other WAGES contexts, the IED can be a water meter, gas meter, air flow meter, or the like.

Generally, the hierarchy classification system 106 utilizes an auto-learned hierarchy algorithm in the monitoring system software that is based on rules and statistical methods. Periodically, the monitoring system software polls each IED M in the utility monitoring system 102 to determine certain characteristics or parameters of the utility monitoring system 102 at that monitored node (represented by M). Multiple samples of specified parameters are taken from each IED in the utility monitoring system 102 at the same given point in time. Once the parameter data is collected from each node M in the utility monitoring system 102, the auto-learned hierarchy algorithm analyzes the data and traces the relationships or links among the monitoring devices with respect to the time the data sample was taken and the associated value of the data sample. This analysis may be performed periodically to increase the probability that the hierarchy is accurate, or to ascertain any changes in the hierarchy. Once this iterative process reaches some predetermined level of statistical confidence that the determined layout of the electrical system 102 is correct, the auto-learned hierarchy algorithm ends. The final layout of the utility monitoring system 102 is then presented to the user for concurrence. As each IED's data is evaluated over time (the learning period) with respect to all other IEDs using the auto-learned hierarchy algorithm, a basic layout of the hierarchical structure of the utility monitoring system 102 is determined based on the monitoring points available. In this respect, the auto-learned hierarchy algorithm uses historical trends of the data from each IED, and those trends are compared to determine whether any interrelationship (link) exists between the IEDs. A more detailed hierarchical structure can be determined with more monitoring points available for analysis.

Samples of specific parameters or characteristics (such as power, energy, voltage, current, or the like in an electrical system) are simultaneously taken from each IED in the utility monitoring system 102. This data is stored and analyzed with respect to the time the sample is taken, the associated value of the data point, and the IED providing the data. Data taken from each IED in the utility monitoring system 102 is compared with each other to determine whether any correlation exists between the IEDs. The data is analyzed for statistical trends and correlations as well as similarities and differences over a predetermined period of time.

The data alignment system 104 aligns data, such as power, voltage, current, time, events, and the like, from the multiple IEDs in the utility monitoring system 102. When data from all the IEDs is aligned to the same point (or approximately the same point based on pseudo-temporal alignment) in time that the data occurred, the data can be put into a temporal (synchronous) or pseudo-temporal (pseudo-synchronous) context from which additional decisions regarding hardware and software configuration can be automatically made or recommended. The measured data from various IEDs may be synchronized or approximately synchronized with each other within a temporal or pseudo-temporal context. Temporal alignment is more precise than pseudo-temporal alignment. Temporal alignment relates to alignment of meter cycle counts in time. Pseudo-temporal alignment systems typically utilize a global positioning system (GPS) or network time protocol (NTP) for clock synchronization. Automatic temporal alignment implementations are described in commonly assigned U.S. patent application Ser. No. 11/174,099, filed Jul. 1, 2005, entitled "Automated Precision Alignment of Data in a Utility Monitoring System," and in commonly assigned PCT Patent Application No. PCT/US2006/034394, titled "Improvements in Hierarchy Determination for Power Monitoring Systems," filed Nov. 5, 2007 [SPL-0099]. In an automatic temporal alignment implementation, the data alignment system 104 synchronously aligns all IEDs (represented by M) in an electrical system hierarchy to the zero-crossing of all three phase voltages without the use of additional hardware, notwithstanding potential phase shifts between various IEDs, such as for example, those caused by certain transformer configurations. When the data of the monitoring devices is aligned synchronously, in a temporal sense, with each other, the system data is essentially aligned with respect to the time it occurred, making more complex data analyses feasible.

The data integrated monitoring system 100 also includes a virtual device evaluation system 105 according to aspects of the present invention, which may receive device data associated with the electrical system 102 via manual or automated methods. The virtual device evaluation system 105 includes the algorithms 300, 400, 500 disclosed herein. As used herein a "virtual" device or load is not a physical device, but represents what characteristics of the utility that a physical device, if it were placed in the hierarchy, would measure. An IED is not a virtual device as used herein.

The virtual device evaluation system 105 uses several techniques to improve the accuracy of virtual meters, such as $V_1$ shown in FIG. 1. Some of these techniques address the inherent accuracy constraints of physical IEDs, while other techniques address the sampling synchronicity across the physical IEDs used to calculate the virtual meter's data. Additionally, the virtual device evaluation system 105 makes recommendations to end-users regarding the need for additional monitoring devices at certain points within the monitoring system 102.

Virtual data is calculated using the differences between measured parameters flowing into a system node and the measured parameters flowing out of the same system node. For example, the general equation used to calculate the real power (kW) as determined for the virtual meter $V_1$ shown in FIG. 1 (when the utility system 102 is a power monitoring system) would be:

$$\text{Virtual Meter} = P - \sum_{n=1}^{N} c_n \quad \text{(Equation 1)}$$

where meter P equals the measured power flowing into the system node and sum of meters $C_1$ through $C_N$ equal the measured power flowing out of the same system node. The unmetered parameters as indicated by the virtual meter are sometimes referred to as a 'residual' value because they represent the mathematical remainder of the system. For example, in FIG. 1, P represents the power (when the utility system is an electrical power system) measured by $M_2$, which is the parent of IEDs $M_4$ and $M_5$.

While the equation shown above is fundamentally correct, it does not represent all relevant considerations. For example, what if measurements taken by one or more of the IEDs (P, $C_1, C_2 \ldots C_N$) are inaccurate? What if one or more of the instrument transformers used by the IEDs are inaccurate? What if the data sample taken from parent IED P is not synchronous with the data sample taken from one of the other child IEDs ($C_1, C_2 \ldots C_N$)? Any one of these conditions will result in some degree of error being injected into Equation 1. A more exact equation for the virtual meter would be:

$$\text{Virtual Meter} \approx (P \pm e_p) - \sum_{n=1}^{N} (C_n \pm e_{c_n}) \quad \text{(Equation 2)}$$

where $$e_p = (\pm P_{me} \pm P_{ite})$$

and $$e_{c_n} = (\pm C_{n,me} \pm C_{n,ite})$$

for a given parameter. The subscript (me) refers to measurement error by an IED, and the subscript (ite) refers to instrument transformer error. It should be noted that synchronicity error is not accounted for in this equation. "P" represents a quantity of a characteristic of the utility being monitored by a parent IED in the hierarchy, such as power or water flow rate. "C" represents a quantity of a characteristic of the utility being monitored by a physical child IED that is directly linked to the parent IED in the hierarchy. A measurement error is typically expressed as a percentage, and reflects a range of percentage error that can affect an IED's measurements. For example, if a measurement error for an IED of a particular type is ±0.2%, this means that if an IED of that type reports that it measures 10,000 W, then the actual power can be within the range of 9,980 W to 10,020 W, yielding a 40 W range of error. Because every IED can vary slightly from another even when they are of the same type and manufactured according to the same process, the error for each IED can differ slightly. For example, the measurement error for a first IED may be 0.2%, but for a second IED, the measurement error may be 0.1%. The accuracy or error associated with an IED of a particular type is typically available from the manufacturer's specifications for the IED. Otherwise, it can be determined by the end-user by applying a known quantity of a characteristic to an IED, measuring the quantity of the characteristic by the IED, and determining a percentage difference between the measured quantity and the actual quantity.

The consequences of these errors may be significant or trivial depending on each error component's magnitude and sign. In some instances these errors may accrue and in other instances they may nullify each other. To compound matters, the error associated with each physical IED (P, $C_1, C_2, \ldots C_N$) is independent from every other physical IED (P, $C_1, C_2, \ldots C_N$) so that the consequences are completely unpredictable. For example, a system that is completely monitored (i.e., all paths into and out of a system are physically metered) may appear to have residual paths (i.e., unmetered loads) as a result of the measurement errors described above. The virtual device evaluation system 105 does not necessarily eliminate these errors, but attempts to reduce and manage the errors in order to minimize their influence and potential distraction to the end-user.

Statistical Method for Accounting for Measurement Error in Determining the Presence or Absence of a Virtual Meter A first described aspect provides a method to determine whether a residual parameter indicates additional unmetered paths or is merely due to measurement error by the IED and instrument transformer error ($P_{me}$, $C_{n\,me}$, $P_{ite}$, and $C_{n\,ite}$) of the physical IEDs. While the illustrations below assume power as the parameter (characteristic) for the sake of convenience, it is contemplated that any other WAGES parameters (characteristics) can be used instead. One or more of the following three assumptions can be made:

1. A single metered utility path exists into the system node being analyzed, and this metered utility is distributed through a bus to feeders below it in the network hierarchy (as illustrated in the utility system 102 shown in FIG. 1).
2. There are at least N physical IEDs (where N>0) monitoring the different feeders (as illustrated in the utility system 102 shown in FIG. 1).
3. The measurement error probability density function (pdf) of a given IED has a normal distribution.

Let $\mu_P$ and $\sigma_P$ be the mean and standard deviation, respectively, of the error for an IED (and its associated instrument transformers) monitoring the bus (parent) expressed as a percent. Because the error in the power measured by the parent IED has a normal distribution (Assumption #3), the following equations are valid:

$$P_{PTMIN} = P_P(1 + (\mu_P - 2\sigma_P)/100) \quad \text{(Equation 3)}$$

$$P_{PTMAX} = P_P(1 + (\mu_P + 2\sigma_P)/100) \quad \text{(Equation 4)}$$

where $P_{PTMIN}$ and $P_{PTMAX}$ are the minimum and maximum values or quantities, respectively, for the true measurement of the power with a 95% confidence, and $P_P$ is a measured quantity of the power measured by IED P.

Assuming that no additional utility paths exist (i.e., no virtual meter), the sum of the measurements from the IEDs on the feeders (children $C_1$ through $C_N$) will equal the measurement of the parent IED P within the error tolerance of the parent and child IEDs. It is known from elementary probability theory that the sum of N normally distributed random variables is also normal with mean and variance as follows:

$$\mu_s = \sum_{n=1}^{N} \mu_n \quad \text{(Equation 5)}$$

$$\sigma_s^2 = \sum_{n=1}^{N} \sigma_n^2 \quad \text{(Equation 6)}$$

Applying the same reasoning to the sum of the power measurements of the child IEDs as to the parent, the following may be obtained:

$$P_{SMIN} = P_{PTMIN}(1 + (\mu_S - 2\sigma_S)/100) \quad \text{(Equation 7)}$$

$$P_{SMAX} = P_{PTMAX}(1 + (\mu_S + 2\sigma_S)/100) \quad \text{(Equation 8)}$$

Assuming that no unmetered (virtual) path exists, the difference between the parent measurement and the sum of the measurements of the children would have the following minimum and maximum:

$$P_{DMIN} = P_{PTMIN} - P_{SMAX} \quad \text{(Equation 9)}$$

$$P_{DMAX} = P_{PTMAX} - P_{SMIN} \quad \text{(Equation 10)}$$

It is now possible to make a judgment as to whether or not additional unmetered paths exist. Three conditions are of importance:

$$P_{DMIN} \leq P_P - P_S \leq P_{DMAX}, \quad \text{(Equation 11)}$$

$$P_{DMIN} > P_P - P_S, \quad \text{(Equation 12)}$$

and $$P_{DMAX} < P_P - P_S \quad \text{(Equation 13)}$$

In these three expressions, $P_P$ is as defined above and $$P_s = \sum_{n=1}^{N} P_{c_n} \quad \text{(Equation 14)}$$

where $P_{C_n}$ represents a quantity of power measured by a child IED n. In the first case, $P_P - P_S$ falls within the error tolerance of the IEDs (and instrument transformers) and thus no unmetered paths are assumed. In the second case, an unmetered path is supplying power to the system (a generator perhaps?). In the third case, an unmetered path of magnitude $P_P - P_S$ is consuming power.

Example of Statistical Method for Accounting for Measurement Error in Determining the Presence or Absence of a Virtual Meter Assume the following parameters and quantities:

$\mu_P = 0$ $\sigma_P = 0.2\%$ $N = 2$ $\mu_{C1} = \mu_{C2} = 0$ $\sigma_{C1} = \sigma_{C2} = 0.5\%$ $P_P = 100$ kW (e.g., $M_2$ from FIG. 1)

$P_{C1} = 35$ kW (e.g., $M_4$ from FIG. 1)

$P_{C2} = 60$ kW (e.g., $M_5$ from FIG. 1)

The following quantities are yielded from the equations above:

$\sigma_S = \sqrt{\sigma_{C_1}^2 + \sigma_{C_2}^2} = 0.5\sqrt{2} = 0.707$ $P_S = P_{C_1} + P_{C_2} = 95$ kW $P_{PTMIN} = 100$ kW$(1 - 2*0.2/100) = 99.6$ kW $P_{PTMAX} = 100$ kW$(1 + 2*0.2/100) = 100.4$ kW $P_{SMIN} = 99.6$ kW$(1 - 2*0.707/100) = 98.2$ kW $P_{SMAX} = 100.4$ kW$(1 + 2*0.707/100) = 101.8$ kW $P_{DMIN} = 99.6$ kW $- 101.8$ kW $= -2.2$ kW $P_{DMAX} = 100.4$ kW $- 98.2$ kW $= 2.2$ kW $P_P - P_S = 100$ kW $- 95$ kW $= 5$ kW Now it can be seen that $P_{DMAX} < P_P - P_S$, and thus there is assumed to be an unmetered utility path of approximately 5 kW (e.g., $V_1$ from FIG. 1). In this example, the hierarchy would be updated to include a virtually metered load (such as $V_1$ from FIG. 1) and all calculated residual values from the difference between $P_P$ and $P_S$ would be attributed to that virtual meter $V_1$. It should be noted that a confidence level of 95% was assumed in determining the range of the measurements for the parent and child IEDs, which used two standard deviations. Using one standard deviation would produce a range with approximately 68% confidence and using three standard deviations would produce a range with approximately 99.7% confidence.

Absolute (Non-Statistical) Method for Accounting for Measurement Error in Determining the Presence or Absence of a Virtual Meter A second described aspect provides an alternate method to determine whether a residual parameter indicates additional unmetered paths or is merely due to measurement error by the IED and instrument transformer error ($P_{me}$, $C_{n\ me}$, $P_{ite}$, and $C_{n\ ite}$). The illustrations below assume water flow as the parameter for the sake of convenience; however, of course any other WAGES parameters can be used instead.

Figure 2:
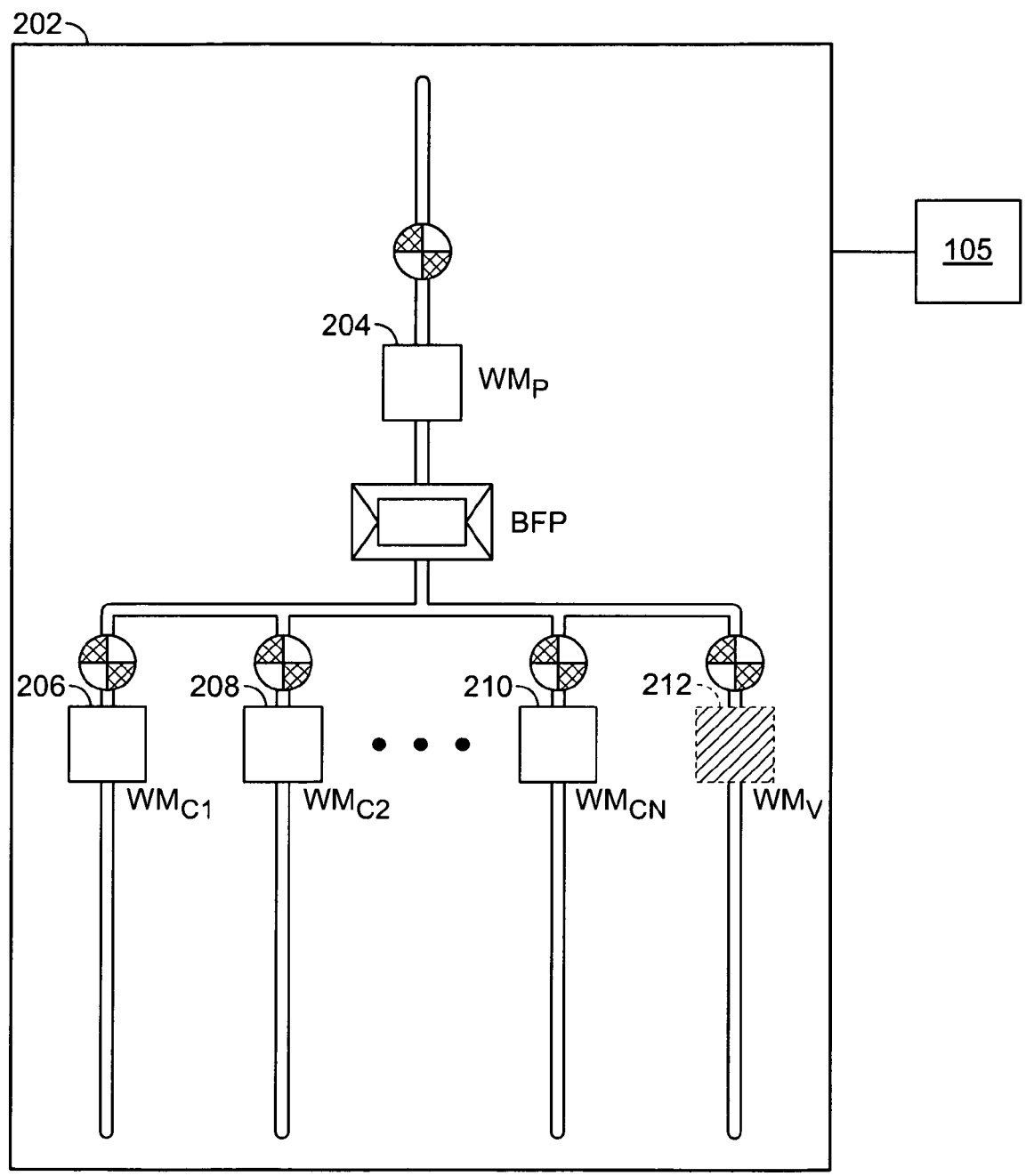
FIG. 2 is an exemplary hierarchy of a water system showing a virtual water meter and physical water meters.
Figure 3:
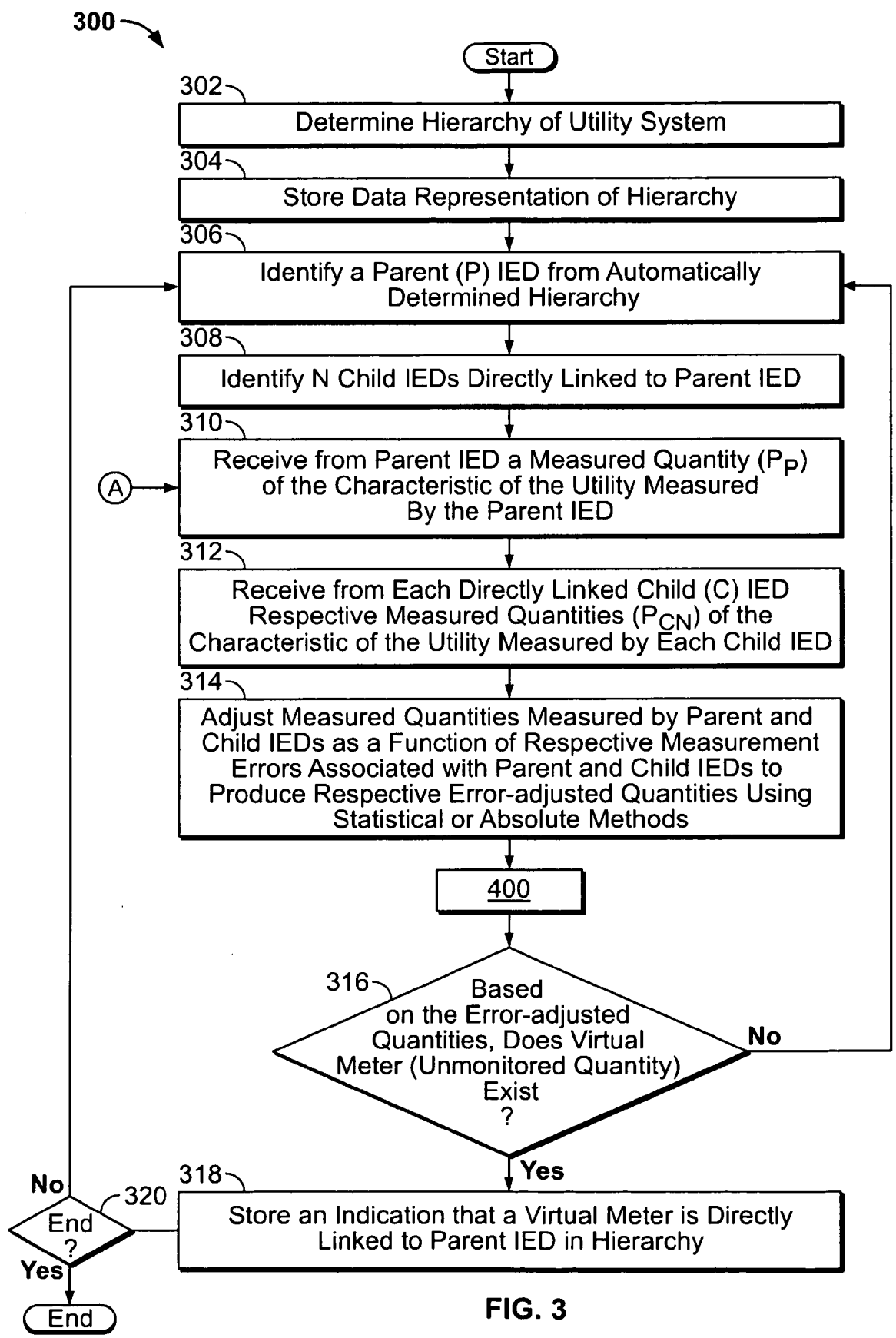
FIG. 3 is a flow chart for automatically determining whether an unmonitored path exists in a hierarchy of a utility system.

FIG. 2 illustrates a water monitoring system 202 communicatively coupled to the virtual device evaluation system 105. The water monitoring system 202 includes a parent water meter, $WM_P$, 204, and a number N of child water meters, $WM_{C1}$ 206, $WM_{C2}$ 208, $WM_{CN}$ 210, directly linked to the parent meter. A virtual water meter, $WM_V$ 212, which may or may not be present, is shown in hatched/dashed lines. The absolute method determines whether $WM_V$ exists, and, if so, what quantity of water flow would be attributable to it and is it measuring consumption or production of water.

Using the absolute method, the minimum value for the water flow through the main (parent) IED 204 is $WM_{PMIN}$ and the maximum value for the water flow through the main (parent) IED 204 is $WM_{PMAX}$.

Assuming no unmetered utility paths exist (virtual water flow), the sum of the water flow measurements from the child IEDs 206, 208, 210 on the feeders (children $WM_{C1}$, $WM_{C2}$, ... $WM_{CN}$) will equal the reading of the parent IED 204 $WM_P$ within the absolute error of the main (parent) 204 and child IEDs 206, 208, 210 (children $WM_{C1}$, $WM_{C2}$, ... $WM_{CN}$). Again assuming no unmetered utility paths exist (virtual water flow), the difference between the parent measurement ($WM_P$ 204) and the sum of the measurements of the children ($WM_S$ 206, 208, 210) would have the following absolute minimum and maximum:

$$WM_{DMIN} = WM_{PMIN} - WM_{SMAX} \quad \text{(Equation 15)}$$

$$WM_{DMAX} = WN_{PMAX} - WM_{SMIN} \quad \text{(Equation 16)}$$

It is now possible to make a judgment as to whether or not additional unmetered paths exist. Three conditions are of importance:

$$WM_{DMIN} \leq WM_P - WM_S \leq WM_{DMAX}, \quad \text{(Equation 17)}$$

$$WM_{DMIN} > WM_P - WM_S, \quad \text{(Equation 18)}$$

and $$WM_{DMAX} < WM_P - WM_S \quad \text{(Equation 19)}$$

In these three expressions, $WM_P$ is as defined as the actual reading of the parent IED 204, and $$WM_s = \sum_{n=1}^{N} WM_{C_n} \quad \text{(Equation 20)}$$

where $WM_{C_n}$ represents the actual readings of the child IEDs 206, 208, 210, respectively. $WM_S$ represents the sum of these actual readings.

In the first case, $WM_P - WM_S$ falls within the error tolerance of the IEDs and thus no unmetered (virtual) paths are assumed. In the second case, an unmetered path is supplying water (the utility being monitored) to the system. In the third case, an unmetered path of magnitude $WM_P - WM_S$ is consuming water.

Example of Absolute Method for Accounting for Measurement Error in Determining the Presence or Absence of a Virtual Meter Assume the following parameters and quantities:

$WM_{P\ error} = 0.2\%$ $WM_{C1\ error} = 0.5\%$ $WM_{C2\ error} = 0.5\%$

N=2

$WM_P = 1000$ gal/min $WM_{C1} = 495$ gal/min $WM_{C2} = 499$ gal/min

The following quantities are yielded from the equations above:

$WM_{P\ MIN} = 1000(1 - 0.2/100) = 998$ gal/min $WM_{P\ MAX} = 1000(1 + 0.2/100) = 1002$ gal/min $WM_{C\ MIN} = 495(1 - 0.5/100) + 499(1 - 0.5/100) = 492.525 + 496.505 = 989.03$ gal/min $WM_{C\ MAX} = 495(1 + 0.5/100) + 499(1 + 0.5/100) = 497.475 + 501.495 = 998.97$ gal/min $WM_{DMIN} = 998$ gal/min $- 998.97$ gal/min $= -0.97$ gal/min $WM_{DMAX} = 1002$ gal/min $- 989.03$ gal/min $= 12.97$ gal/min $WM_P - WM_S = 1000$ gal/min $- 495$ gal/min $- 499$ gal/min $= 6$ gal/min It is apparent that $WM_{DMAX} > WM_P - WM_S$, and thus the residual water flow is attributed to measurement error by the IEDs. In this specific example, the hierarchy would not depict a virtual device $WM_V$ and residual values would be ignored or divided evenly between the physical IEDs.

Figure 5:
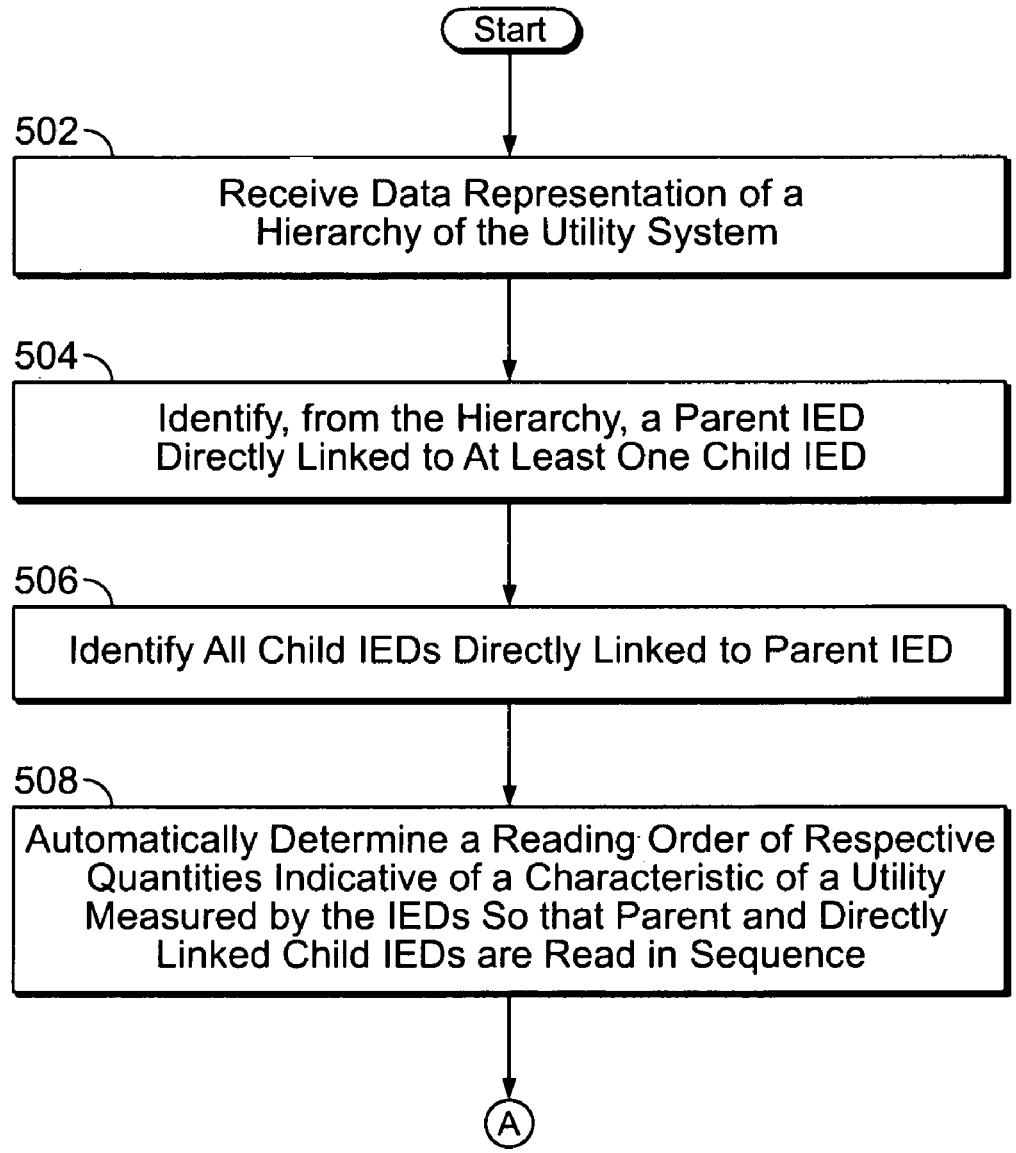
FIG. 5 is a flow chart for automatically determining a reading sequence of IEDs such that a parent IEDs and its associated directly linked child IEDs are read in sequence to improve the synchronicity of the received measured data and thereby increase the accuracy of characterizing unmonitored paths or loads in the hierarchy.

Method for Reducing the Effect of Measurement Error on Unmetered (Virtual) Loads The above-mentioned aspects disclose methods to determine whether a residual parameter indicates additional unmetered paths or is merely due to the measurement error associated with physical IEDs. The purpose of the third aspect is to reduce the effect of measurement errors on virtual meters by optimizing the order that measurement data is read from the IEDs in the hierarchy such that data from parent-child groupings in the hierarchy is received as synchronously as possible to ensure optimum accuracy. An exemplary flow chart of this third aspect is shown in FIG. 5 and described in more detail in the next section.

As previously indicated, data for the virtual meter $V_1$ is calculated from physical IEDs that are linked to one other. Empirical data has shown that the order of sampling data from physical IEDs can affect the accuracy of virtually metered data because an arbitrary order introduces a latency that reduces the synchronicity of sampling with the related physical IEDs. The virtual device evaluation system 105 uses a hierarchical (spatial) context of the IEDs to automatically adapt/adjust the reading order of physical IEDs to improve the synchronicity of sampling between related IEDs. By adjusting the reading order so that a parent IED and its respective children IEDs are read sequentially, the synchronicity error is reduced resulting in a more accurate virtual measurement.

Referring to FIG. 1 as an example, it is important that the data measurements of the characteristics of the utility received from IEDs $M_2$, $M_4$ and $M_5$ be acquired as synchronously as possible with respect to each other. Any latency between the samples taken from IEDs $M_2$, $M_4$ and $M_5$ increases the likelihood of introducing error to the calculated virtual measurement ($V_1$). By contiguously sampling IEDs $M_2$, $M_4$ and $M_5$, the latencies are reduced (i.e., more synchronous) and the accuracies of the residual calculations for $V_1$ are improved as a result.

This aspect generally requires knowledge of each physical IED's spatial relationship with respect to every other physical IED in a hierarchy. These spatial relationships can be determined either automatically, such as by an auto-learned hierarchy algorithm, or manually by the end-user. Another method would be to manually configure the sampling order for devices without entering the monitoring system's hierarchy.

Once a hierarchy is known and the sequence order of receiving measured data from the IEDs is adjusted, either the absolute or statistical method described above can be used to ascertain the existence of unmetered paths. The addition, relocation, or elimination of new IEDs in a utility system hierarchy necessitates adjustments to the sequence order of reading data and a re-evaluation of the virtual meter itself.

Because unmetered loads exist in basically every monitoring system, it is important to have the capability to accurately "meter" these unmetered paths (virtual meters). Determining whether or not an unmetered path exists is critical to account for the utility product's consumption within the utility system 102. These aspects disclosed herein are important for developing a more accurate utility monitoring system model (including unmetered paths) for end-users.

Exemplary Algorithms

As mentioned above, the virtual device evaluation system 105 includes an algorithm 300. The algorithm 300 manually or automatically determines a hierarchy of the utility system being analyzed using the auto-learned hierarchy algorithm described above (302). The hierarchy indicates how a number, N, of IEDs are linked to one another in the utility system (e.g., directly, indirectly, or not at all). Each IED monitors one or more characteristics (e.g., power, voltage, current) of the utility (e.g., WAGES). The algorithm 300 stores a data representation of the hierarchy in a computer-readable medium (304). The data representation includes a data structure that indicates how the IEDs are linked together to form the hierarchy. The algorithm 300 identifies a parent IED (designated by subscript P) from the automatically determined hierarchy that is directly linked to at least one child IED (306). The algorithm 300 identifies a number, N, of child IEDs (designated by subscript C) that are directly linked to the parent IED in the hierarchy (308). For example, in FIG. 1, parent IED $M_2$ is directly linked to child IEDs $M_4$ and $M_5$. IED $M_3$ is not linked at all to IEDs $M_2$, $M_4$, or $M_5$. IEDs $M_4$ and $M_5$ are indirectly linked to the main IED $M_1$.

An actual measured quantity, designated by $P_P$, is received from the parent IED (310). The "P" refers to the measured quantity, and the subscript P refers to the parent IED. The measured quantity is a quantity of a characteristic of the utility measured by the parent IED. For example, in the electrical utility context, the quantity can be expressed as a value in kW, which represents an amount of power measured by the parent IED. In the water utility context, the quantity can be expressed as a value in gallons per minute, which represents an amount of water flow measured by the parent IED. Respective measured quantities, designated by $P_{CN}$, are received from each of the directly linked child IEDs (312). For example, if there are two child IEDs, such that N=2, $P_{C1}$ represents the quantity measured by a first child IED and $P_{C2}$ represents the quantity measured by a second child IED. Each child IED measures the same characteristic of the utility (e.g., power, water flow) that was measured by the parent IED and by each other.

The algorithm 314 automatically adjusts the respective measured quantities measured by the parent IED and by the child IEDs as a function of respective measurement errors associated with the parent and child IEDs to produce respective error-adjusted quantities using statistical or absolute methods (314). Put differently, each of the quantities measured by the parent and child IEDs is adjusted to account for the measurement error associated with each respective IED. As described above, there are two methods for error-adjusting the measured quantities by an IED: statistical or absolute. These methods are described in more detail in connection with the algorithm 400 shown in FIG. 4.

Once the algorithm 300 has determined the error-adjusted quantities measured by the parent and associated directly linked child IEDs, the algorithm 300 determines, based on the error-adjusted quantities, whether a virtual meter (unmonitored quantity) exists in the hierarchy (316). This virtual meter would represent an unmonitored quantity directly linked to the parent. The determination as to whether this virtual exists is thus more accurate because it has accounted for measurement errors and instrument transformer errors. The algorithm 300 stores an indication that the virtual meter is directly linked to the parent IED in the hierarchy (318). The algorithm 300 also stores an unmonitored quantity as an indication of the virtual meter. For example, in the statistical method example provided above, an unmonitored quantity of 5 kW was calculated from the actual quantities measured by the parent and directly linked child IEDs. The algorithm 300 determines whether it should end (320), such as by checking whether all parent IEDs in the hierarchy have been checked for children, and, if so, it ends. Otherwise, it returns to block 306 to identify the next parent IED that is directly linked to one or more child IEDs.

Figure 4:
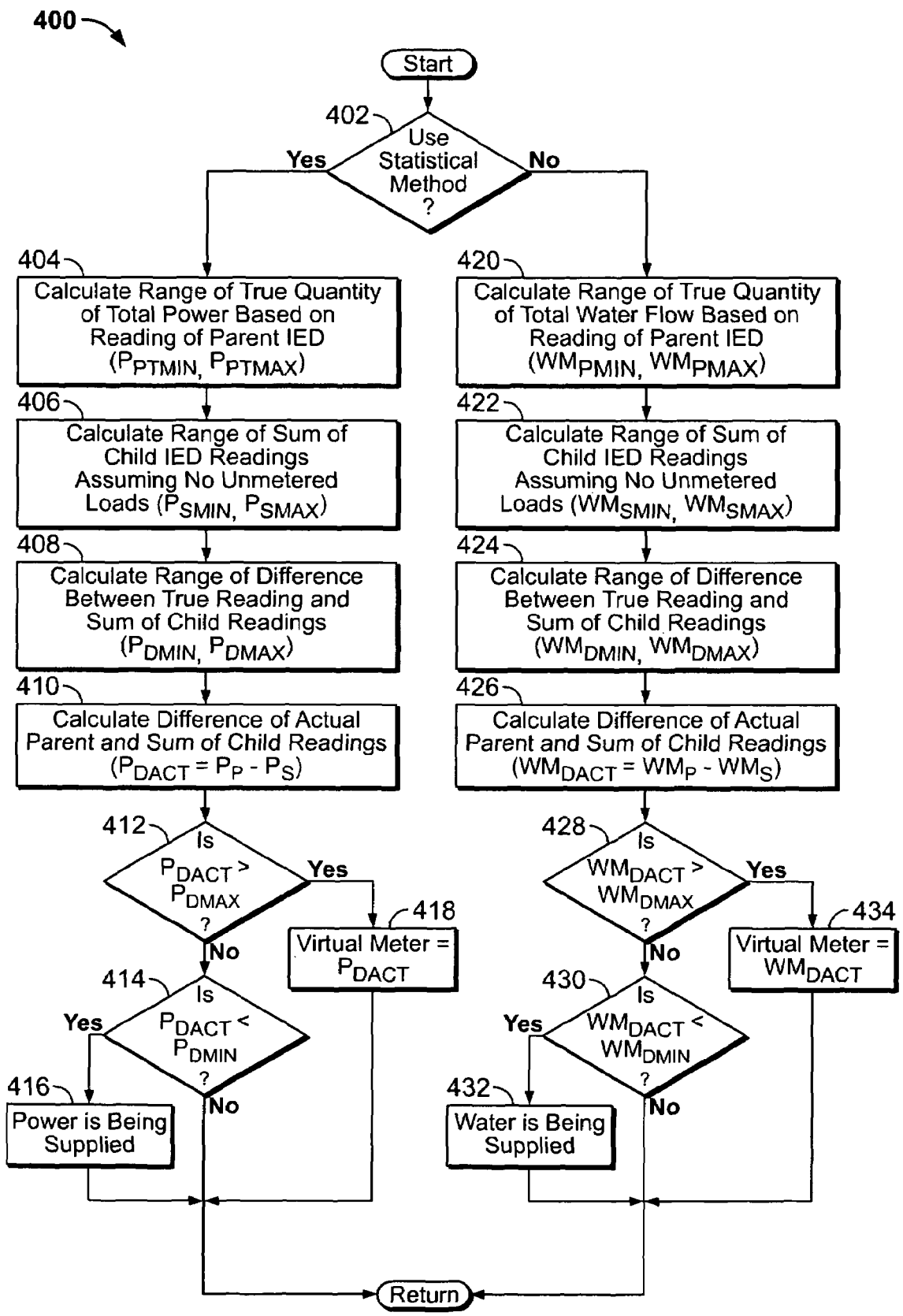
FIG. 4 is a flow chart of a statistical and an absolute method for determining whether an unmonitored path exists in the hierarchy.

FIG. 4 is a flow chart of the algorithm 400 for determining the error-adjusted quantities measured by the IEDs under consideration. The algorithm 400 determines whether to use a statistical method for adjusting the measured quantities (402). The algorithm 400 can make this determination automatically, or it may do both methods, or it may receive an input from the end-user as to which method to carry out. When a statistical method is used (402), the algorithm 400 calculates a range (minimum, maximum) of a true quantity of total power based on a reading of the parent IED by calculating, for example, Equations 3 and 4 above based on the mean and standard deviation of the measurement error for the parent IED and on $P_P$ (404). Two error-adjusted measured quantities are produced from this calculation: a minimum measured quantity, $P_{PTMIN}$, and a maximum measured quantity, $P_{PTMAX}$. By true, it is meant that the actual reading from the IED will be somewhere between the minimum and maximum quantities but not outside of this range.

The algorithm 400 calculates a range (minimum, maximum) of the sum of child IED readings assuming that there are no unmetered loads connected to the parent IED by calculating, for example, Equations 7 and 8 above based on the mean and variance of the deviations associated with the child IEDs (406). Two sum (designated by subscript S) quantities are produced from this calculation: a minimum sum quantity, $P_{SMIN}$, and a maximum sum quantity, $P_{SMAX}$.

The algorithm 400 calculates a range (minimum, maximum) of the difference between the true reading measured by the parent IED (within its associated error tolerance) and the sum of the child readings (within their respective associated error tolerances) by, for example, calculating Equations 9 and 10 above based on the previously calculated quantities $P_{PTMIN}$, $P_{PTMAX}$, $P_{SMIN}$, and $P_{SMAX}$ (408). Two difference (designated by subscript D) quantities are produced from this calculation: a minimum difference quantity, $P_{DMIN}$, and a maximum difference quantity, $P_{DMAX}$.

The algorithm 400 calculates the difference between the actual parent measured quantity $P_P$ and the sum of the actual child measured quantities $P_S$, where $P_S$ can be calculated using, for example, Equation 14 above (410). This difference, $P_P-P_S$, is designated as $P_{DACT}$, or the actual difference between the parent and children measured quantities.

The algorithm 400 determines whether $P_{DACT}$ is greater than $P_{DMAX}$ (412) If so, then a virtual meter exists and is consuming a quantity of the characteristic (power in this example) of the utility (electricity in this example) corresponding to $P_{DACT}$ (418). Otherwise, the algorithm 400 determines whether $P_{DACT}$ is less than $P_{DMIN}$ (414). If so, the algorithm 400 determines that power is being supplied by an unmetered path (416). Otherwise, if $P_P-P_S$ falls within the error tolerance of the IEDs and instrument transformers, the algorithm 400 determines that are no unmetered paths and returns. It should be emphasized that although the characteristic for the statistical method shown in FIG. 4 is power for convenience, any other characteristic of the WAGES utilities can be used.

When an absolute method is used (402), the algorithm calculates a range of true quantity of total water flow based on the actual reading from a parent IED in the hierarchy (420). Again, water flow is used for convenience only and any other characteristic of the WAGES utility can be used instead. This calculation produces $WM_{PMIN}$ and $WM_{PMAX}$.

The algorithm 400 calculates a range of the sum of the child IED measurements assuming that no unmetered loads exist that are directly linked to the parent IED in the hierarchy using equations similar to Equations 7 and 8 above but substituting the absolute error for the mean and standard deviation of the error (422). This calculation produces $WM_{SMIN}$ and $WM_{SMAX}$.

The algorithm 400 calculates a range of the difference between the true measurement from the parent IED and the sum of the true measurements from the child IEDs by calculating Equations 15 and 16 above (424). This calculation produces $WD_{DMIN}$ and $WD_{DMAX}$.

The algorithm 400 calculates the difference between the actual measurement from the parent IED, $WM_P$, and the sum of the actual measurements from the child IEDs, $WM_S$, to produce $WM_{DACT}$ (426). If $WM_{DACT}$ is greater than $WM_{DMAX}$ (428), the algorithm 400 determines that a virtual meter is consuming water in an amount corresponding to $WM_{ACT}$ (434). If $WM_{DACT}$ is less than $WM_{DMIN}$ (430), the algorithm 400 determines that water is being supplied by the unmetered path (432). If $WM_{DACT}$ falls within the error tolerance of the IEDs, the algorithm 400 determines that no unmetered paths directly linked to the parent IED exist.

FIG. 5 is a flow chart diagram of an example algorithm 500 for automatically adjusting a reading order of IEDs to increase the accuracy of reading groupings of IEDs and improve the synchronicity of their measured data as it is received by the managing software 110. The algorithm 500 receives a data representation of a hierarchy of the utility system (502). The hierarchy indicates how a number, N, of IEDs are linked to one another in the utility system 102. Each IED monitors one or more characteristics of a utility monitored by the IEDs in the utility system. The hierarchy can be determined automatically by the auto-learned hierarchy algorithm or entered manually by the end-user as an input to the algorithm 500.

The algorithm 500 identifies, from the hierarchy, a parent IED that is directly linked to at least one child IED (504). Once the hierarchy is known, the spatial relationships of all of the IEDs are known, and parent IEDs with child IEDs and any of their "progeny" as well as childless parent IEDs can be identified. The algorithm identifies all child IEDs that are directly linked to the parent IED (506). There may be only one child IED or more than one child IED that is directly linked to the parent IED. For example, in FIG. 1, IED $M_1$ is directly linked to two child IEDs, $M_2$ and $M_3$. The algorithm 500 automatically determines a reading order or sequence of respective quantities indicative of a characteristic of a utility measured by the IEDs so that the parent IED and its associated directly linked child IEDs are read in sequence as a group (508). For example, referring to FIG. 1, the algorithm 500 adjusts the reading order so that characteristics data measured by the IEDs $M_2$, $M_4$, and $M_5$ are read in sequence. In other words, prior to the adjustment, the managing software 110 may have read the IEDs in the following order: $M_1$, $M_2$, $M_3$, $M_4$, $M_5$. The algorithm 500 adjusts the reading order by grouping $M_2$, $M_4$, and $M_5$ together such that $M_3$ is not read in between this grouping. Likewise, the algorithm 500 would adjust the reading order by grouping $M_1$, $M_2$, and $M_3$ together as a group. In this case, $M_2$ would be read twice to ensure accurate virtual meter evaluation for both groups. Once the reading orders have been adjusted, optionally, the presence or absence of a virtual meter can be automatically determined by any of the methods or algorithms disclosed herein, such as algorithms 300, 400 (e.g., such as by returning to block 310). In this context, a "group" or "grouping" of IEDs means that, for example, a parent IED and its directly linked child IEDs form a single group. Thus, in FIG. 1, $M_2$ and $M_3$ form a group with respect to $M_1$ (because $M_1$ is the parent directly linked to $M_2$ and $M_3$), but $M_3$ does not form a group with respect to $M_2$, $M_4$, and $M_5$ because $M_3$ is not directly linked to $M_4$ or $M_5$.

Any of the algorithms disclosed herein, including the auto-learned algorithm, and the algorithms 300, 400, 500 include machine readable instructions for execution by: (a) a processor, (b) a controller, and/or (c) any other suitable processing device. It will be readily understood that the computer 132 includes such a suitable processing device. Any algorithm disclosed herein may be embodied in software stored on a tangible medium such as, for example, a flash memory, a CD-ROM, a floppy disk, a hard drive, a digital versatile disk (DVD), or other memory devices, but persons of ordinary skill in the art will readily appreciate that the entire algorithm and/or parts thereof could alternatively be executed by a device other than a controller and/or embodied in firmware or dedicated hardware in a well known manner (e.g., it may be implemented by an application specific integrated circuit (ASIC), a programmable logic device (PLD), a field programmable logic device (FPLD), discrete logic, etc.). Also, some or all of the machine readable instructions represented in any flowchart depicted herein may be implemented manually. Further, although specific algorithms are described with reference to flowcharts depicted herein, persons of ordinary skill in the art will readily appreciate that many other methods of implementing the example machine readable instructions may alternatively be used. For example, the order of execution of the blocks may be changed, and/or some of the blocks described may be changed, eliminated, or combined.

While particular embodiments and applications of the present invention have been illustrated and described, it is to be understood that the invention is not limited to the precise construction and compositions disclosed herein and that various modifications, changes, and variations can be apparent from the foregoing descriptions without departing from the spirit and scope of the invention as defined in the appended claims.

What is claimed is:

1. A method of automatically determining whether an unmonitored portion exists in a utility system, comprising:
   determining a hierarchy of the utility system, the hierarchy indicating how a number of intelligent electronic devices (IEDs) are linked to one another in the utility system, each of the IEDs monitoring one or more characteristics of a utility;
   automatically storing a data representation of the hierarchy;
   identifying, from the hierarchy, a parent IED in the hierarchy that is directly linked to at least one child IED;
   identifying, from the hierarchy, all of one or more child IEDs that are directly linked in the hierarchy to the parent IED;
   receiving from the parent IED a measured quantity, $P_P$, of the characteristic of the utility measured by the parent IED;
   receiving from each of the one or more child IEDs respective measured quantities of the characteristic of the utility measured by each of the one or more child IEDs;
   adjusting the measured quantities measured by the parent IED and by the one or more child IEDs as a function of respective measurement errors associated with the parent IED and with the one or more child IEDs to produce respective error-adjusted quantities; and
   based on the error-adjusted quantities, determining whether an unmonitored quantity exists in the utility system, and, if so, storing an indication that a virtual device directly linked to the parent IED exists in the hierarchy.

2. The method of claim 1, wherein the determining the hierarchy is carried out automatically, the method further comprising:
   calculating a difference between (a) the error-adjusted quantity associated with the parent IED and (b) the sum of the error-adjusted quantities associated with the one or more child IEDs, wherein the determining whether the unmonitored quantity exists in the utility system includes determining whether the calculated difference is within an error tolerance, and, if not, carrying out the storing; and
   storing the unmonitored quantity and an indication that the virtual device is consuming or producing the unmonitored quantity.

3. The method of claim 1, wherein the function for producing the error-adjusted quantity associated with the parent includes calculating a minimum quantity, $P_{PTMIN}$, and a maximum quantity, $P_{PTMAX}$, based on at least $P_P$, a mean of measurement error associated with the parent IED, and a standard deviation of measurement error associated with the parent IED.

4. The method of claim 3, wherein the function for producing the error-adjusted quantities associated with the one or more child IEDs includes:
   calculating a minimum quantity, $P_{SMIN}$, based on $P_{PTMIN}$, an aggregate mean associated with a mean of measurement error of each of the one or more child IEDs, and an aggregate standard deviation associated with a standard deviation of measurement error of each of the one or more child IEDs;
   calculating a maximum quantity, $P_{SMAX}$, based on $P_{PTMAX}$, the aggregate mean, and the aggregate standard deviation;
   calculating a minimum difference quantity, $P_{DMIN}$, between $P_{PTMIN}$ and $P_{SMAX}$; and
   calculating a maximum difference quantity, $P_{DMAX}$, between $P_{PTMAX}$ and $P_{SMIN}$.

5. The method of claim 4, further comprising adding the respective measured quantities measured by the one or more IEDs to produce a total measured quantity, $P_S$, wherein the determining whether the unmonitored quantity exists in the utility system includes, responsive to $P_P-P_S$ being greater than or equal to $P_{DMIN}$ and $P_P-P_S$ being less than or equal to $P_{DMAX}$, determining that no unmonitored quantity exists.

6. The method of claim 4, further comprising adding the respective measured quantities measured by the one or more IEDs to produce a total measured quantity, $P_S$, wherein the determining whether the unmonitored quantity exists in the utility system further includes, responsive to $P_P-P_S$ being less than $P_{DMIN}$, determining that the unmonitored quantity does exist and storing an indication that the virtual device is supplying the characteristic of the utility to the utility system.

7. The method of claim 4, further comprising adding the respective measured quantities measured by the one or more IEDs to produce a total measured quantity, $P_S$, wherein the determining whether the unmonitored quantity exists in the utility system further includes, responsive to $P_P-P_S$ being greater than $P_{DMAX}$, determining that the unmonitored quantity does exist and storing an indication that the virtual device is consuming the characteristic of the utility to the utility system.

8. The method of claim 1, wherein the function for producing the error-adjusted quantity associated with the parent includes calculating a minimum quantity, $P_{PMIN}$, and a maximum quantity, $P_{PMAX}$, based on at least $P_P$ and an absolute measurement error associated with the parent IED.

9. The method of claim 8, wherein the function for producing the error-adjusted quantities associated with the one or more child IEDs includes:
   calculating a minimum quantity, $P_{SMIN}$, based on the sum of the measured quantities measured by the one or more child IEDs and an absolute measurement error associated with the one or more child IEDs;
   calculating a maximum quantity, $P_{SMAX}$, based on the sum of the measured quantities measured by the one or more child IEDs and an absolute measurement error associated with the one or more child IEDs;

calculating an absolute minimum difference quantity, $P_{DMIN}$, between $P_{PMIN}$ and $P_{SMAX}$;

calculating an absolute maximum difference quantity, $P_{DMAX}$, between $P_{PMAX}$ and $P_{SMIN}$.

10. The method of claim 9, further comprising adding the respective measured quantities measured by the one or more IEDs to produce a total measured quantity, $P_S$, wherein the determining whether the unmonitored quantity exists in the utility system further includes, responsive to $P_P-P_S$ being greater than or equal to $P_{DMIN}$ and $P_P-P_S$ being less than or equal to $P_{DMAX}$, determining that no unmonitored quantity exists.

11. The method of claim 9, further comprising adding the respective measured quantities measured by the one or more IEDs to produce a total measured quantity, $P_S$, wherein the determining whether the unmonitored quantity exists in the utility system further includes; responsive to $P_P-P_S$ being less than $P_{DMIN}$, determining that the unmonitored quantity does exist and storing an indication that the virtual device is supplying the characteristic of the utility.

12. The method of claim 9, further comprising adding the respective measured quantities measured by the one or more IEDs to produce a total measured quantity, $P_S$, wherein the determining whether the unmonitored quantity exists in the utility system further includes, responsive to $P_P-P_S$ being greater than $P_{DMAX}$, determining that the unmonitored quantity does exist and storing an indication that the virtual device is consuming the characteristic of the utility.

13. The method of claim 1, wherein the IEDs are power meters, wherein the utility is electricity, and wherein the one or more characteristics includes power, current, or voltage.

14. The method of claim 1, wherein the utility is water, air, gas, electricity, or steam, and wherein the one or more characteristic includes power, voltage, current, voltage distortion, BTU per hour, MBTU per hour, energy, gallons per minute, or cubic feet per minute.

15. The method of claim 1, further comprising determining a reading order of the respective measured quantities from the parent IED and the one or more child IEDs such that, after the measured quantity is received from the parent IED, the measured quantities from each of the one or more child IEDs are received prior to receiving a measured quantity from any other IED in the hierarchy.

16. A method of automatically determining a reading order of respective quantities indicative of a characteristic of a utility monitored by intelligent electronic devices (IEDs) arranged in a hierarchy of a utility system, comprising:
receiving a data representation of a hierarchy of the utility system, the hierarchy indicating how a number of intelligent electronic devices (IEDs) are linked to one another in the utility system, each of the IEDs monitoring one or more characteristics of a utility;

identifying, from the hierarchy, a parent IED in the hierarchy that is directly linked to at least one child IED;

identifying, from the hierarchy, all of one or more child IEDs that are directly linked in the hierarchy to the parent IED;

automatically determining a reading order of respective quantities indicative of a characteristic of a utility measured by the IEDs such that, after a measured quantity is received from the parent IED, measured quantities from each of the one or more child IEDs are received prior to receiving a measured quantity from another IED in the hierarchy; and automatically determining a quantity of a characteristic of a utility attributable to an unmonitored portion of the hierarchy.

17. The method of claim 16, further comprising:
receiving from the parent IED, according to the reading order, a measured quantity, $P_P$, of the characteristic of the utility measured by the parent IED;

receiving from each of the one or more child IEDs, according to the reading order, respective measured quantities of the characteristic of the utility measured by each of the one or more child IEDs;

adjusting the measured quantities measured by the parent IED and by the one or more child IEDs as a function of respective measurement errors associated with the parent IED and with the one or more child IEDs to produce respective error-adjusted quantities; and based on the error-adjusted quantities, determining whether an unmonitored quantity exists in the utility system, and, if so, storing the unmonitored quantity and an indication that a virtual device corresponding to the unmonitored quantity is directly linked to the parent IED in the hierarchy.

18. The method of claim 16, further comprising calculating a difference between (a) the error-adjusted quantity associated with the parent IED and (b) the sum of the error-adjusted quantities associated with the one or more child IEDs, wherein the determining whether the unmonitored quantity exists in the utility system includes determining whether the calculated difference is within an error tolerance, and, if not, carrying out the storing.

19. The method of claim 16, wherein the IEDs are power meters, wherein the utility is electricity, and wherein the one or more characteristics includes power, current, or voltage.

20. The method of claim 16, wherein the utility is water, air, gas, electricity, or steam, and wherein the one or more characteristic includes power, voltage, current, voltage distortion, BTU per hour, MBTU per hour, energy, gallons per minute, or cubic feet per minute.

* * * * *